(12) United States Patent
Kim et al.

(10) Patent No.: US 12,720,954 B2
(45) Date of Patent: Aug. 25, 2026

(54) DISPLAY APPARATUS IMPROVING LIGHT EFFRICIENCY AND PREVENTING COLOR MIXTURE

(71) Applicant: LG DISPLAY CO., LTD., Seoul (KR)

(72) Inventors: Ho-Jin Kim, Paju-si (KR); Minki Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 869 days.

(21) Appl. No.: 18/074,895

(22) Filed: Dec. 5, 2022

(65) Prior Publication Data

US 2023/0217692 A1 Jul. 6, 2023

(30) Foreign Application Priority Data

Dec. 30, 2021 (KR) ........................ 10-2021-0193009

(51) Int. Cl.
*H10K 50/858* (2023.01)
*H10K 59/122* (2023.01)
*H10K 59/124* (2023.01)
*H10K 59/38* (2023.01)

(52) U.S. Cl.
CPC ......... *H10K 50/858* (2023.02); *H10K 59/122* (2023.02); *H10K 59/124* (2023.02); *H10K 59/38* (2023.02)

(58) Field of Classification Search
None
See application file for complete search history.

(56) References Cited

U.S. PATENT DOCUMENTS 10,916,589 B2 2/2021 Bang et al.
11,282,896 B2 3/2022 Kim et al.
2013/0021550 A1* 1/2013 Watakabe ......... G02F 1/136209 349/61
2018/0122868 A1* 5/2018 Kim ....................... H10K 50/84
2018/0151628 A1* 5/2018 Park ..................... H10K 59/876
2018/0159080 A1* 6/2018 Shimoyama ......... H10K 59/873
2019/0005863 A1 1/2019 Koshihara
2020/0027932 A1 1/2020 Choi et al.
2020/0035951 A1 1/2020 Cheon et al.
2021/0175468 A1* 6/2021 Lee ....................... H10K 59/40
(Continued)

FOREIGN PATENT DOCUMENTS

EP 3 331 047 A1 6/2018
JP 2015-207544 A 11/2015
(Continued)

*Primary Examiner* — Nduka E Ojeh
(74) *Attorney, Agent, or Firm* — Birch, Stewart, Kolasch & Birch, LLP

(57) ABSTRACT

A display device includes a plurality of pixels disposed on a substrate, in which each pixel includes a first subpixel, a second subpixel adjacent to the first subpixel, and a third subpixel adjacent to the second subpixel, the second subpixel disposed between the first subpixel and the third subpixel. A first color filter is disposed in the first subpixel, and is configured to emit light having a first color, a second color filter is disposed in the second subpixel, and is configured to emit light having a second color, and a third color filter is disposed in the third subpixel, and is configured to emit light having a third color. Further, an upper surface of the second color filter is disposed a greater distance from the substrate than an upper surface of the first color filter.

22 Claims, 7 Drawing Sheets

(56) References Cited

U.S. PATENT DOCUMENTS

| | | | | |
|---|---|---|---|---|
| 2024/0215373 | A1* | 6/2024 | Kang | H10K 59/122 |
| 2025/0107411 | A1* | 3/2025 | Jia | H10K 59/879 |
| 2025/0234742 | A1* | 7/2025 | Zhu | H10K 59/8792 |

FOREIGN PATENT DOCUMENTS

| | | | |
|---|---|---|---|
| JP | 2018-81799 | A | 5/2018 |
| JP | 2018-92873 | A | 6/2018 |
| JP | 2018-107444 | A | 7/2018 |
| JP | 2019-185887 | A | 10/2019 |
| JP | 2020-184480 | A | 11/2020 |
| KR | 10-2018-0061711 | A | 6/2018 |
| KR | 10-2018-0065916 | A | 6/2018 |
| KR | 10-2019-0072824 | A | 6/2019 |
| KR | 10-2043413 | B1 | 12/2019 |
| KR | 10-2020-0082666 | A | 7/2020 |
| KR | 10-2021-0017493 | A | 2/2021 |

* cited by examiner 100
130
131
SP1
SP
SP2
SP3
131a
131b
132b
132a
132
133b
133a
133
L1
L2
A
190
170
150
118
117
1163
1162
1161
1152
1151
116
115
113
111a
111c
111b
111
BL
110
I'
I
112d
112a
112b
112c
112
1143
SL
CE
1142
1141
114
E1H
E2H
H1
H2

100
130
131
SP
SP1
SP2
SP3
131a 131b
132b
132a
132
133b 133a
133
L2
L1
EC2T
EC1T
OA
190
170
150
118
117
1163
1162
1161
1152
1151
116
115
113
111a
111c
111b
111
BL
110
I'
I
112d
112a
112b
112c
112
1143
SL
CE
1142
1141
114
131b
131
118
150
132b
132

100
130
131
SP
SP1
SP2
SP3
131a 131b
132b
132a
132
133b 133a
133
L2
L1
190
170
150
118
117
1163
1162
1161
116
1153
1152
1151
115
113
111a
111c
111b
111
BL
110
I'
I
112d
112a
112b
112c
112
1143
CE1
SL CE1
CE2 CE2
CE1
1142
SL
1141
114
E1H
E2H
E3H 100
130
131
SP
SP1
SP2
SP3
131a
131b
132b
132a
132
133b
133a
133
L2
L1
L3
ET1
ET2
CFT1
CFT2
190
170
150
118
117
1163
1162
1161
1152
1151
116
115
113
111a
111c
111b
111
BL
110
I'
I
112d
112a
112b
112c
112
1143
SL
CE
1142
118a
118b
1141
114
E1H
E2H
H1
H2

DISPLAY APPARATUS IMPROVING LIGHT EFFRICIENCY AND PREVENTING COLOR MIXTURE

CROSS-REFERENCE TO RELATED APPLICATIONS

This application claims the priority benefit of the Korean Patent Application No. 10-2021-0193009, filed on Dec. 30, 2021, the entire contents of which are hereby expressly incorporated by reference into the present application.

BACKGROUND

Field of the Invention

The present disclosure relates to a display apparatus for displaying an image.

Discussion of the Related Art

With the advancement of the information age, the demand for a display apparatus for displaying an image has increased. Therefore, different display apparatuses such as a liquid crystal display (LCD) device, a plasma display panel (PDP) device, an organic light emitting display (OLED) device, and a quantum dot light emitting display (QLED) device have been recently used.

Among the display apparatuses, OLED and QLED devices are self-light emitting types, and have advantages in that a viewing angle and a contrast ratio are improved compared to the LCD device. Also, because the OLED and QLED devices do not require a separate backlight unit, the devices can be advantageously thin and lightweight and also have low power consumption.

Recently, an organic light emitting display apparatus having densely disposed pixels to implement high resolution has been developed. However, when an interval between the pixels is too narrow, current can leak from a pixel for emitting light to an adjacent pixel not used for emitting light. Thus, light can be emitted from the adjacent pixel due to the leakage current thereby causing a color mixture. In addition, the narrow interval between the pixels makes it more difficult to change a structure for improving light efficiency.

SUMMARY OF THE DISCLOSURE

Accordingly, one object of the present disclosure is to address the above-noted and other problems.

Another object of the present disclosure is to provide a display apparatus that improves light efficiency and prevents a color mixture from occurring.

To achieve these and other advantages and in accordance with the purpose of the present invention, as embodied and broadly described herein, the present invention provides in one aspect a display device including a plurality of pixels disposed on a substrate, in which each pixel includes a first subpixel, a second subpixel adjacent to the first subpixel, and a third subpixel adjacent to the second subpixel, the second subpixel disposed between the first subpixel and the third subpixel; a first color filter disposed in the first subpixel, and configured to emit light having a first color; a second color filter disposed in the second subpixel, and configured to emit light having a second color; and a third color filter disposed in the third subpixel, and configured to emit light having a third color. Further, an upper surface of the second color filter is disposed a greater distance from the substrate than an upper surface of the first color filter, and the first subpixel further includes a first light path changing layer disposed on the first color filter and contacting a first side surface of the second color filter.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
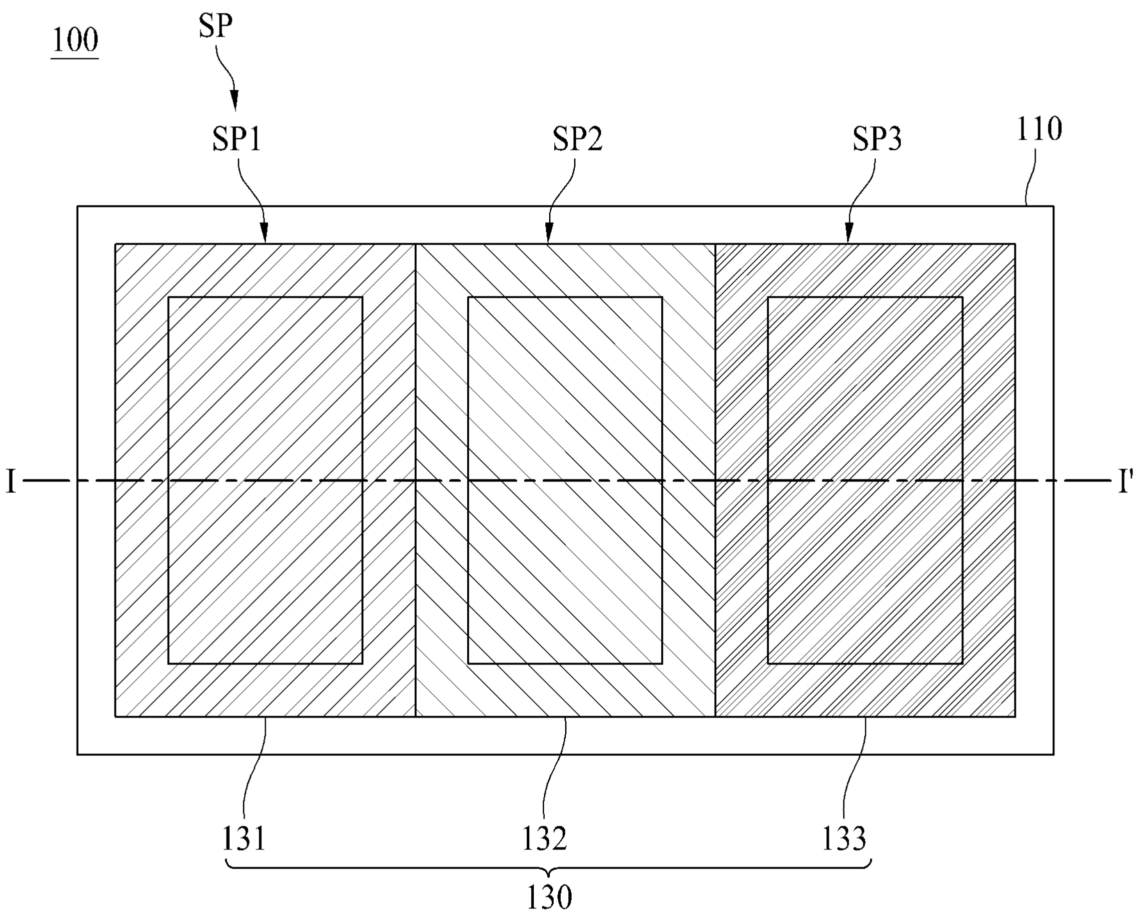
FIG. 1 is a schematic plan view illustrating a display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When 'comprise,' 'have,' and 'include' described in the present specification are used, another part can be added unless 'only~' is used. The terms of a singular form can include plural forms unless referred to the contrary. In construing an element, the element is construed as including an error range although there is no explicit description. In describing a position relationship, for example, when a position relation between two parts is described as 'on~,'

'over~,' 'under~,' and 'next~,' one or more other parts can be disposed between the two parts unless 'just' or 'direct' is used.

In describing a temporal relationship, for example, when the temporal order is described as "after," "subsequent," "next," and "before," a case which is not continuous can be included, unless "just" or "direct" is used. Although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and can have broader directionality within the range that elements of the present disclosure can act functionally. The term "at least one" should be understood as including all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure can be partially or overall coupled to or combined with each other and can be variously inter-operated with each other and driven technically as those skilled in the art can sufficiently understand. The embodiments of the present disclosure can be performed independently from each other or can be performed together in co-dependent relationship.

Hereinafter, the embodiments of the present disclosure will be described in detail with reference to the accompanying drawings. In particular, FIG. 1 is a schematic plan view illustrating a display apparatus, FIG. 2 is a cross-sectional view taken along line I-I' shown in FIG. 1, and FIG. 3 is an enlarged view illustrating a portion A of FIG. 2 according to an embodiment of the present invention.

Figure 2:
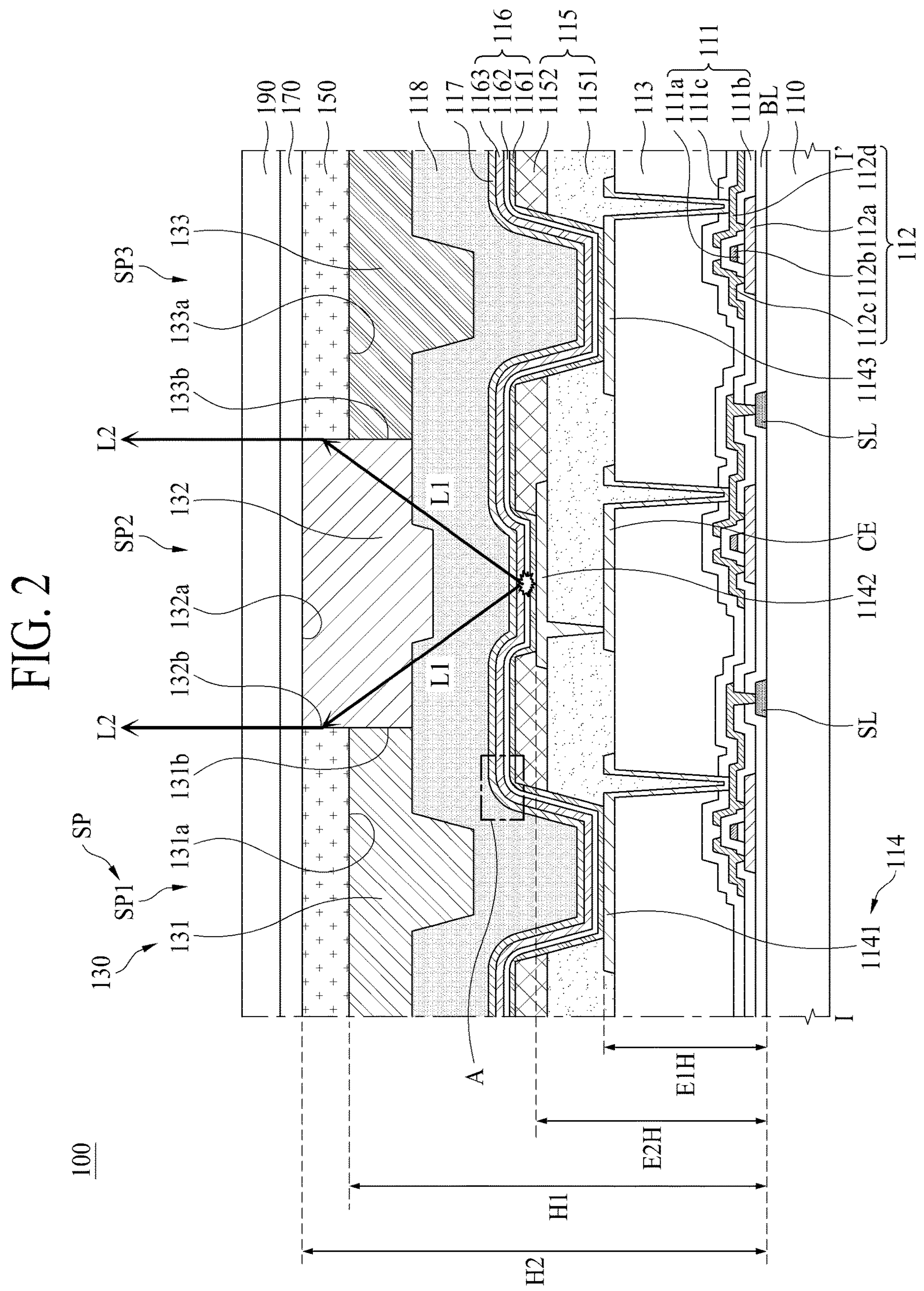
FIG. 2 is a cross-sectional view taken along line I-I' shown in FIG. 1.
Figure 3:
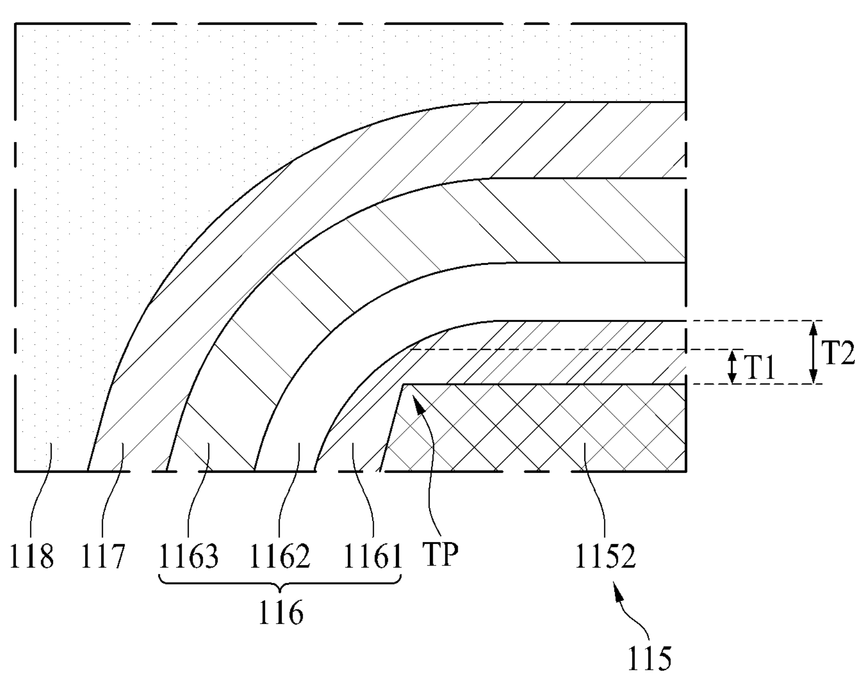
FIG. 3 is an enlarged view illustrating a portion A of FIG. 2.

As shown, FIGS. 1-3 illustrate a display apparatus 100 including a substrate 110 having a plurality of subpixels, a color filter 130 and a light path changing layer 150. The substrate 110 includes pixels P, each of which can include a plurality of subpixels. For example, as shown in FIG. 1, the plurality of subpixels can include a first subpixel SP1 provided on the substrate 110, a second subpixel SP2 adjacent to the first subpixel SP1, and a third subpixel SP3 adjacent to the second subpixel SP2. As shown, the subpixels SP1, SP2 and SP3 are disposed adjacent to one another in a first direction, which is a horizontal direction in FIG. 1. The horizontal direction can be a direction in which a signal line SL (shown in FIG. 2) of the display apparatus 100 is disposed. In one example, the signal line SL can be a gate line.

In addition, the color filter 130 converts or filters light emitted from an organic light emitting layer 116 provided between the substrate 110 and the color filter 130 into a color of a corresponding subpixel. In FIG. 1, the color filter 130 includes a first color filter 131 in the first subpixel SP1, a second color filter 132 in the second subpixel SP2, and a third color filter 133 in the third subpixel SP3. For example, the first color filter 131 can be a red color filter that converts white light incident from an organic light emitting layer 116 into red light. The second color filter 132 can be a green color filter that converts the white light incident from the organic light emitting layer 116 into green light, and the third color filter 133 can be a blue color filter that converts the white light incident from the organic light emitting layer 116 into blue light.

When the red, green and blue light respectively emitted through the first, second and third color filters 131, 132 and 133 are mixed, a user views white light. Further, each color filter 130 can include an upper surface, and first and second sides connected to the upper surface. For example, as shown in FIG. 2, the first color filter 131 includes an upper surface **131*a* positioned toward a second substrate 190, and a side 131*b* connected to the upper surface 131*a*. Also, the second color filter 132 includes an upper surface 132*a* positioned toward the second substrate 190, and a side 132*b* connected to the upper surface 132*a*, and the third color filter 133 includes an upper surface 133*a* positioned toward the second substrate 190, and a side 133*b* connected to the upper surface 133*a***.

In addition, as shown in FIG. 2, the display apparatus 100 includes a light path changing layer 150 on a side of one or more of the color filters 131, 132 and 133. The light path changing layer 150 changes a path of light emitted through the color filter 130. For example, the light path changing layer 150 changes a light path so that side light L1 emitted toward the subpixel adjacent to the subpixel emitting light is changed to be emitted toward the subpixel emitting light.

Further, the light path changing layer 150 includes a refractive index different from that of the color filter 130, thereby changing a path of light incident from the color filter 130. For example, the light path changing layer 150 can have a refractive index smaller or lower than that of the color filter 130, so that the side light L1 emitted from the subpixel towards its adjacent subpixel can be changed to light L2 (or front light L2) emitted toward the subpixel for emitting light as shown in FIG. 2. The light path changing layer 150 according to an example can be air, but is not limited thereto, and may be another material having a refractive index smaller or lower than that of the color filter 130.

Therefore, as the display apparatus 100 includes a light path changing layer 150 adjacent to a side of the color filter 130, the side light L1 emitted toward the adjacent non-emitting subpixel can be changed and converted into the front light L2, whereby the front light efficiency of the subpixel emitting light can be improved.

Referring to FIG. 2, the substrate 110 includes a thin film transistor, and may be a transistor array substrate, a lower substrate, a base substrate, or a first substrate, for example. The substrate 110 may be a transparent glass substrate, a transparent plastic substrate, or a silicon wafer substrate. Hereinafter, the substrate 110 will be defined as a first substrate. An opposite substrate 190 can be provided on the first substrate 110.

Figure 7:
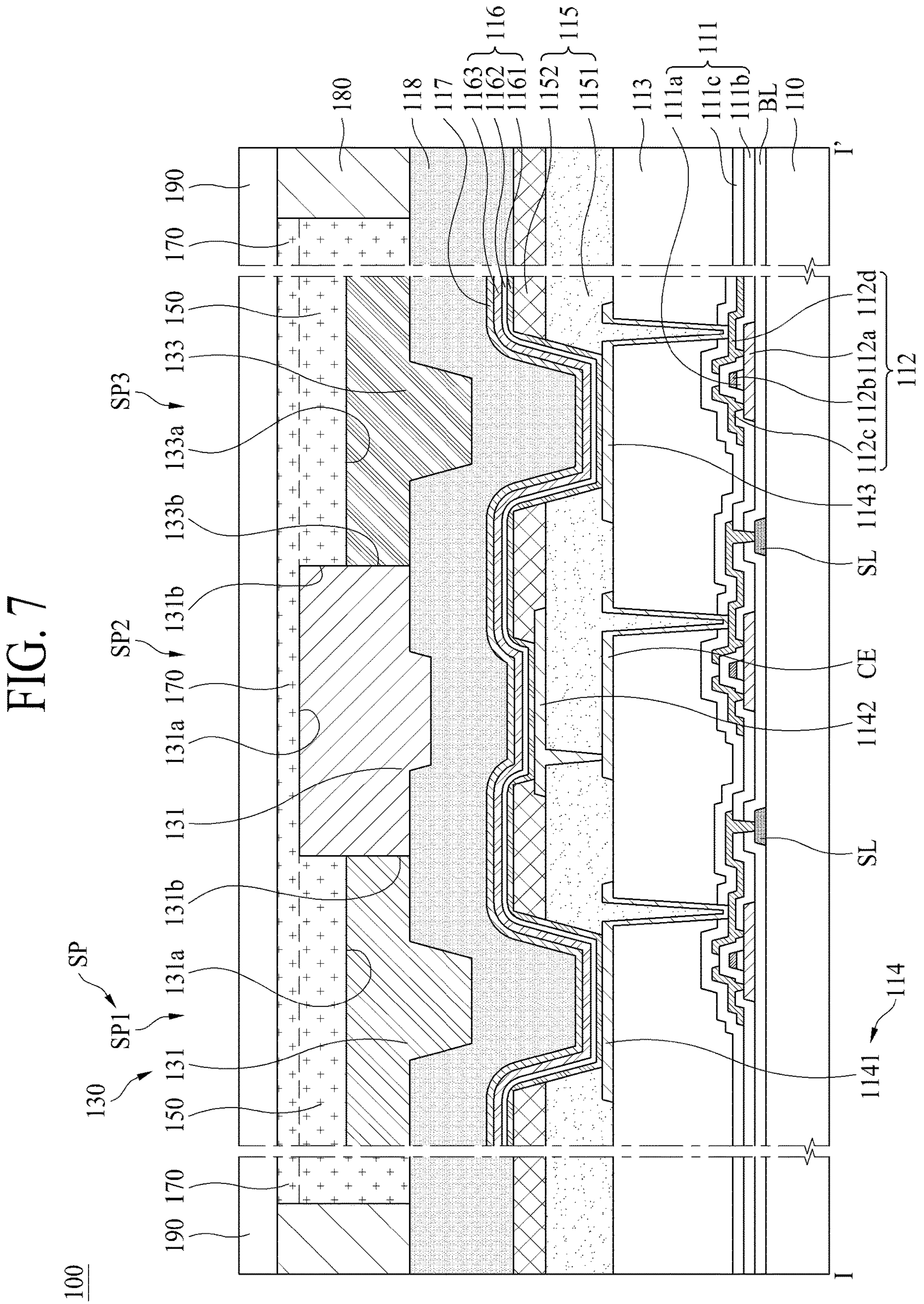
FIG. 7 is a schematic cross-sectional view illustrating another example of a display apparatus according to an embodiment of the present disclosure.

For example, the opposite substrate 190 can be bonded to a first surface or upper surface of the first substrate 110 via an adhesive layer 180 (FIG. 7). The opposite substrate 190 can also have a size smaller than that of the first substrate 110, and be bonded to the other portion except a pad portion of the first substrate 110. The opposite substrate 190 can also be an upper substrate, a second substrate, or an encapsulation substrate. Hereinafter, the opposite substrate 190 will be defined as the second substrate.

In addition, the first substrate 110 according to an example may include a plurality of subpixels. For example, as shown in FIG. 1, the first substrate 110 may include a first subpixel SP1, a second subpixel SP2 adjacent to the first subpixel SP1, and a third subpixel SP3 adjacent to the second subpixel SP2. The first, second and third subpixels according to an example emit red, green and blue light, respectively. Each subpixel SP1, SP2 and SP3 can also be defined as an area of a minimum unit in which light is actually emitted.

Further, each subpixel SP1, SP2 and SP3 includes a thin film transistor and a light emitting element connected to the thin film transistor. FIG. 2 illustrates the light emitting element including the organic light emitting layer 116 interposed between a first electrode 114 and a second electrode 117. As shown, the organic light emitting layer 116 is a common layer commonly deposited on the subpixels SP1, SP2 and SP3.

In addition, in one embodiment, the organic light emitting layer 116 emits white light. In more detail, the organic light emitting layer 116 may include a plurality of stacks that emit light of different colors. For example, as shown in FIGS. 2 and 3, the organic light emitting layer 116 may include a first stack 1161, a second stack 1163, and a charge generation layer (CGL) 1162 provided between the first stack 1161 and the second stack 1163. Because the organic light emitting layer emits white light, each subpixel SP1, SP2 and SP3 may include the color filter 130 matched with a corresponding color. Because the color filter 130 converts or filters the white light emitted from the organic light emitting layer 116, the color filter 130 is disposed on the organic light emitting layer 116.

In addition, as shown in FIG. 2, each subpixel SP1, SP2 and SP3 can include a buffer layer BL disposed on the first substrate 110 to prevent moisture permeation to the thin film transistor 112. Each subpixel also includes an inorganic layer 111 provided on an upper surface of the buffer layer BL. The inorganic layer 111 includes a gate insulating layer 111*a*, an interlayer insulating layer 111*b* and a passivation layer 111*c*. Each subpixel also includes a planarization layer 113 provided on the inorganic layer 111, a first electrode 114 provided on the planarization layer 113, a bank 115, the organic light emitting layer 116, a second electrode 117, and an encapsulation layer 118.

In addition, a thin film transistor 112 for driving the subpixel can be disposed in the inorganic layer 111, and thus the inorganic layer 111 can be called a circuit element layer. Also, the buffer layer BL may be included in the inorganic layer 111 along with the gate insulating layer 111*a*, the interlayer insulating layer 111*b* and the passivation layer 111*c*. The first electrode 114, the organic light emitting layer 116 and the second electrode 117 can also be included in the light emitting element.

The light emitting element is also electrically connected to a signal line SL provided on the first substrate 110. For example, as shown in FIG. 2, the first electrode 114 is electrically connected to the signal line SL by being connected to the thin film transistor 112. A source electrode 112*c* or a drain electrode 112*d* included in the thin film transistor 112 may be connected to the signal line SL.

In addition, the signal line SL is for applying a signal or power source for driving each subpixel SP1, SP2 and SP3, and according to one example may be a gate line. As shown in FIG. 2, the signal line SL is provided between the first substrate 110 and the buffer layer BL, but the buffer layer BL can be disposed in another layer. Each subpixel SP1, SP2 and SP3 is also driven to emit light in accordance with a signal applied from the signal line SL.

Further, as shown in FIG. 2, the buffer layer BL is formed between the first substrate 110 and the gate insulating layer 111*a* to protect the thin film transistor 112. The buffer layer BL can also be disposed entirely on one surface (or front surface) of the first substrate 110. The buffer layer BL prevents a material contained in the first substrate 110 from being diffused into a transistor layer during a high temperature thin film transistor manufacturing process. Optionally, the buffer layer BL can be omitted.

In addition, as shown in FIG. 2, the thin film transistor 112 according to an example may include an active layer 112*a*, a gate electrode 112*b*, a source electrode 112*c*, and a drain electrode 112*d*. The active layer 112*a* includes a channel area, a drain area and a source area, which are formed in a thin film transistor area of a circuit area of the subpixel SP. Further, the drain area and the source area are spaced apart from each other with the channel area interposed therebetween.

Also, the active layer 112*a* may include a semiconductor material based on any one of amorphous silicon, polycrystalline silicon, oxide and organic material, for example. When the first substrate 110 is a silicon wafer substrate, an active layer 112*a* can be formed in the silicon wafer substrate.

As shown in FIG. 2, the gate insulating layer 111*a* is formed on the channel area of the active layer 112*a*. As an example, the gate insulating layer 111*a* can be formed in an island shape only on the channel area of the active layer 112*a*, or can be formed on an entire front surface of the first substrate 110 or the buffer layer BL, which includes the active layer 112*a*. The gate electrode 112*b* can also be formed on the gate insulating layer 111*a* to overlap the channel area 111*c* of the active layer 112*a*.

The interlayer insulating layer 111*b* is formed on the gate electrode 112*b* and the drain area and the source area of the active layer 112*a*. The interlayer insulating layer 111*b* can be formed in the circuit area and an entire light emission area, in which light is emitted to the pixel P. For example, the interlayer insulating layer 111*b* may be made of an inorganic material but is not limited thereto.

Further, as shown in FIG. 2, the source electrode 112*c* is electrically connected to the source area of the active layer 112*a* through a source contact hole provided in the interlayer insulating layer 111*b* overlapped with the source area of the active layer 112*a*. The drain electrode 112*d* is also electrically connected to the drain area of the active layer 112*a* through a drain contact hole provided in the interlayer insulating layer 111*b* overlapped with the drain area of the active layer 112*a*.

The drain electrode 112*d* and the source electrode 112*c* may be made of the same metal material. For example, each of the drain electrode 112*d* and the source electrode 112*c* may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Each of the first and second switching thin film transistors is provided on the circuit area of the pixel P to have the same or similar structure as that of the thin film transistor 112. Also, the capacitor can be provided in an overlap area between the gate electrode 112*b* and the source electrode 112*c* of the thin film transistor 112, which overlap each other with the interlayer insulating layer 111*b* interposed therebetween.

Additionally, to prevent a threshold voltage of the thin film transistor provided in a pixel area from being shifted by light, the display panel or the first substrate 110 may further include a light shielding layer provided below the active layer 112*a* of at least one of the thin film transistor 112, the first switching thin film transistor or the second switching thin film transistor. The light shielding layer can be disposed between the first substrate 110 and the active layer 112*a* to shield light incident on the active layer 112*a* through the first substrate 110, thereby minimizing a change in the threshold voltage of the transistor due to external light.

Further, the protective layer 111*c* is provided on the first substrate 110 to cover the pixel area. In particular, the protective layer 111*c* covers the drain electrode 112*d* and the source electrode 112*c* of the thin film transistor 112 and the interlayer insulating layer 111*b*. The protective layer 111*c* can be entirely formed in the circuit area and the light emission area and be expressed as a passivation layer. The protective layer 111*c* can also be omitted.

As shown in FIG. 2, the planarization layer 113 is formed on the first substrate 110 to cover the protective layer 111*c*. When the protective layer 111*c* is omitted, the planarization layer 113 can be provided on the first substrate 110 to cover the circuit area. The planarization layer 113 can also be formed entirely in the circuit area and the light emission area.

Also, the planarization layer 113 according to one example can be formed to be relatively thick to provide a display area DA including a plurality of subpixels. The planarization layer 113 can be made of an organic material such as photo acryl, benzocyclobutene, polyimide, and fluorine resin, for example.

In addition, as shown in FIG. 2, the first electrode 114 of the subpixel SP is formed on the planarization layer 113. The first electrode 114 is also connected to the drain electrode or the source electrode of the thin film transistor 112 through a contact hole passing through the planarization layer 113 and the protective layer 111*c*.

Further, the first electrode 114 may be made of at least one of a transparent metal material, a semi-transmissive metal material, or a metal material having a high reflectance. When the display apparatus 100 is provided in a top emission mode, the first electrode 114 can be formed of a metal material having a high reflectance or a stacked structure of a metal material having a high reflectance and a transparent metal material. For example, the first electrode 114 can be formed of a metal material having a high reflectance, such as a stacked structure (Ti/Al/Ti) of aluminum and titanium, a stacked structure (ITO/Al/ITO) of aluminum and ITO, an Ag alloy, and a stacked structure (ITO/Ag alloy/ITO) of Ag alloy and ITO. The Ag alloy may be an alloy such as silver (Ag), palladium (Pd), and copper (Cu).

When the display apparatus 100 is provided in a bottom emission mode, the first electrode 114 may be formed of a transparent conductive material (TCO) such as ITO and IZO, which can transmit light, or a semi-transmissive conductive material such as magnesium (Mg), silver (Ag) or an alloy of magnesium (Mg) and silver (Ag). Also, the material constituting the first electrode 114 may include MoTi, and the first electrode 114 may be an anode electrode or a pixel electrode.

In addition, as shown in FIG. 2, the first electrode 114 includes a first sub-electrode 1141 provided in the first subpixel SP1, a second sub-electrode 1142 provided in the second subpixel SP2, and a third sub-electrode 1143 provided in the third subpixel SP3. In the display apparatus 100 according to one embodiment of the present disclosure, one or more of the first sub-electrode 1141, the second sub-electrode 1142 and the third sub-electrode 1143 is provided to be higher than another sub-electrode.

As one or more of the sub-electrodes 1141, 1142 and 1143 are disposed higher than the other sub-electrodes, the color filter disposed on the higher sub-electrode is disposed higher than the other color filters. Therefore, a side of the higher color filter can be in contact with the light path changing layer 150 and thus the side light can be converted into the front light to improve the front light efficiency. Further, the sub-electrode disposed higher means a distance from an upper surface of the first substrate 110 to an upper surface (or lower surface) of the sub-electrode is longer than other sub-electrodes. Likewise, the color filter disposed to be higher means a distance from the upper surface of the first substrate 110 to an upper surface (or lower surface) of the color filter is longer than other color filters.

For example, as shown in FIG. 2, a height E2H of the second sub-electrode 1142 is higher than a height E1H of the first sub-electrode 1141 and/or the third sub-electrode 1143. Therefore, a height H2 of the second color filter 132 disposed in the second sub-electrode 1142 is higher than a height H1 of the first color filter 131 and/or the third color filter 133. Thus, the light path changing layer 150 is in contact with at least a portion of a side 132*b* of the second color filter 132 (i.e., a green color filter).

As the light path changing layer 150 is in contact with the side 132*b* of the second color filter 132, the side light L1 emitted toward the first subpixel SP1 and/or the second subpixel SP2 can be converted or reflected into front light L2 to improve the front light efficiency. As described above, because the refractive index of the light path changing layer 150 is less than that of the second color filter 132, the side light L1 can be totally reflected on a boundary surface between the side 132*b* of the second color filter 132 and the light path changing layer 150, whereby the side light L1 is converted or changed into the front light L2.

In addition, the second color filter 132 is preferably disposed higher than the other color filters 131 and 133 because the luminance of green light is lower than of the illuminance of red light and blue light. For example, as the red light, the green light and the blue light are mixed, a user can view white light. When the luminance of the green light is lower than that of each of the red light and the blue light, the color purity of the white light is lowered, and a yellowish white light may be viewed by the user. Therefore, the green color filter 132 is disposed to be higher than the other color filters 131 and 133, and the light path changing layer 150 is disposed on the side 132*b* of the green color filter 132 to improve luminance of the green light, whereby white light with a higher color purity can be implemented.

In addition, the light path changing layer 150 is disposed on the side 132*b* of the second color filter 132 and contacts the upper surface 131*a* of the first color filter 131 and the upper surface 133*a* of the third color filter 133. However, the present disclosure is not limited to the above structure, and when the luminance of the red light is lower than that of each of the green light and the blue light, the first color filter 131 can be disposed to be higher, and the light path changing layer 150 can be disposed on the side 131*b* of the first color filter 131. Likewise, when the luminance of the blue light is lower than that of each of the red light and the green light, the third color filter 133 can be disposed to be higher, and the light path changing layer 150 can be disposed on the side 133*b* of the third color filter 133.

Referring again to FIG. 2, the bank 115 is a non-light emission area in which light is not emitted, and is provided to surround each of light emission areas of the plurality of subpixels SP1, SP2 and SP3. That is, the bank 115 partition or defines the respective light emission areas. Accordingly, the bank 115 is disposed at a boundary between the plurality of subpixels SP1, SP2, and SP3.

Further, in FIG. 2, the bank 115 is formed on the planarization layer 113 to cover an edge portion of the first electrode 114, thereby partitioning or defining a light emission area of each subpixel. The bank 115 can also be formed to cover the edge portion of the first electrode 114 of each of the subpixels SP and expose a portion (e.g., a central portion) of the first electrode 114. The portion exposed without being covered by the bank 115 is the light emission area. As the bank 115 covers the edge of the first electrode 114, the bank 115 prevents light emitting efficiency from being deteriorated due to a current concentration on each end of the first electrode 114. The bank 115 also prevents the first electrode 114 and the second electrode 117 from being shorted due to the thickness of the organic light emitting layer, which is thin at the edge of the first electrode 114.

Also, according to an embodiment of the present disclosure, the bank 115 preferably has a stacked structure (e.g., a two stacked structure) so one or more of the first electrodes 114 of the plurality of subpixels is disposed higher, thereby disposing the corresponding color filter to be higher than the other color filters. In addition, as discussed above, the side of the higher color filter contacts the light path changing layer 150, and thus the side light can be converted into the front light to improve the front light efficiency. The bank 115 according to an example in FIG. 2 includes a first bank 1151 and a second bank 1152 provided on the first bank 1151. The bank 115 may be formed of an organic layer such as an acrylic resin, an epoxy resin, a phenolic resin, a polyamide resin, and a polyimide resin, but is not limited thereto.

As shown in FIG. 2, the organic light emitting layer 116 is formed to cover the first electrode 114 and the bank 115 and in one example, is provided to emit white light. As shown in FIG. 3, the organic light emitting layer 116 may include a first stack 1161, a second stack 1163, and a charge generation layer (CGL) 1162 provided between the first stack 1161 and the second stack 1163.

Also, the first stack 1161 is provided on the first electrode 114 and may include a hole injecting layer (HIL), a hole transporting layer (HTL), a blue light emitting layer ((EML) B), and an electron transporting layer (ETL) sequentially stacked. Further, the charge generation layer 1162 supplies charges to the first stack 1161 and the second stack 1163. In one example, the charge generation layer 1162 also includes an N-type charge generation layer for supplying electrons to the first stack 1161, and a P-type charge generation layer for supplying holes to the second stack 1163. The N-type charge generation layer may also include a metal material as a dopant. In addition, the second stack 1163 is provided on the first stack 1161 and may include a hole transporting layer (HTL), a yellow green (YG) emitting layer (EML(YG)), an electron transporting layer (ETL) and an electron injecting layer (EIL) are sequentially stacked.

As shown in FIG. 2, because the organic light emitting layer 116 is provided as a common layer, the first stack 1161, the charge generation layer and the second stack 1163 can be disposed over all the subpixels SP1, SP2 and SP3. In addition, the second electrode 117 is formed on the organic light emitting layer 116 and may be a common layer commonly formed in the subpixels SP1, SP2, and SP3. The second electrode 117 can also be made of a transparent metal material, a semi-transmissive metal material or a metal material having high reflectance.

When the display apparatus 100 is provided in a top emission mode, the second electrode 117 may be formed of a transparent conductive material (TCO) such as ITO and IZO, which can transmit light, or a semi-transmissive conductive material such as magnesium (Mg), silver (Ag) or an alloy of magnesium (Mg) and silver (Ag). When the transparent display apparatus 100 is provided in a bottom emission mode, the second electrode 117 may be formed of a metal material having a high reflectance, such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy may be an alloy of silver (Ag), palladium (Pd), copper (Cu), etc. Also, the second electrode 117 may be a counter electrode or a cathode electrode.

In addition, the encapsulation layer 118 is formed on the second electrode 117 and prevents oxygen or water from permeating into the organic light emitting layer 116 and the second electrode 117. Thus, the encapsulation layer 118 may include at least one inorganic layer.

Also, the color filter 130 is disposed on the encapsulation layer 118. As described above, the color filter 130 may include a red color filter 131 provided in the first subpixel SP1, a green color filter 132 provided in the second subpixel SP2, and a blue color filter 133 provided in the third subpixel SP3.

As shown in FIG. 2, the upper layer 170 is disposed on the color filter 130 and is used to bond the second substrate 190 to the first substrate 110. Thus, the upper layer 170 according to an example may be a double-sided tape. After the upper layer 170 is attached onto the second substrate 190, the upper layer 170 can be attached to one or more of the plurality of color filters 130 to bond the second substrate 190 to the first substrate 110.

As shown in FIG. 2, because the light path changing layer 150 is disposed adjacent to the side of the highest placed color filter 130, the upper layer 170 is attached to the light path changing layer 150. Therefore, the upper layer 170 contacts an upper surface of the color filter 130 and an upper surface of the light path changing layer 150. The second substrate 190 is also disposed on the upper layer 170.

Referring to FIG. 2, the organic light emitting layer 116 is a common layer in a plurality of subpixels. When the organic light emitting layer is commonly provided, the current in the light emitting subpixel may leak toward an adjacent non-light emitting subpixel along the organic light emitting layer, so that a color mixture is generated.

However, according to an embodiment of the present disclosure, a height of the bank 115 can be increased to increase a length of the organic light emitting layer 116 disposed between the light emission areas of the respective subpixels. That is, a length of a current path through the organic light emitting layer is increased. As the length of the organic light emitting layer 116 is increased, the amount of the current reaching the adjacent subpixel becomes smaller, so that the adjacent subpixel does not emit light, and a color mixture can be avoided.

Thus, the display apparatus 100 according to one embodiment of the present disclosure includes a first bank 1151 disposed on an upper surface of the planarization layer 113, and a second bank 1152 disposed on the first bank 1151. As the second bank 1152 is disposed on the first bank 1151, the overall height of the bank 115 is increased, so that the length of the organic light emitting layer 116 disposed between the light emission areas of the subpixels is also lengthened. Therefore, the length of the current path for reducing or blocking the leakage current can be increased.

As shown in FIG. 3, the bank 115 includes a taper TP. In more detail, after the first electrode 114 is formed on the planarization layer 113, the bank 115 can be formed by depositing and patterning a material constituting the bank 115 (e.g., using a photo process with a mask and an etching process). As the material constituting the bank 115 is patterned by the photo process and the etching process, the bank 115 includes an angled edge-shaped taper TP having an inclined surface connected to the first electrode 114 as shown in FIG. 3.

Because the display apparatus 100 includes two or more banks, that is, a first bank 1151, and a second bank 1152 disposed on the first bank 1151, the taper TP can be provided in the second bank 1152 positioned on the upper side. Due to the taper TP included in the bank 115, the organic light emitting layer 116 formed entirely in a subsequent process can have a thinner thickness in a portion where the taper TP is disposed. For example, as shown in FIG. 3, a thickness T1 of the organic light emitting layer 116 overlapped with the taper TP in a thickness direction of the first substrate 110 is thinner than a thickness T2 of the organic light emitting layer 116 not overlapped with the taper TP. Because the organic light emitting layer 116 has a step coverage lower than that of a metal material, its thickness can be thinner on the edge portion of the taper TP and/or the inclined surface of the taper TP.

In the display apparatus 100 according to one embodiment of the present disclosure, the bank 115 is provided to include the taper TP, so that the thickness of the organic light emitting layer 116 is thinner in a taper area in which the taper TP is provided. Because the resistance of the organic light emitting layer 116 or charge generation layer is increased in a portion where the thickness of the organic light emitting layer 116 becomes thinner, the current can be prevented from leaking from the subpixel for emitting light to the subpixel for not emitting light. Therefore, a color mixture between the subpixels caused by the leakage current can be prevented.

Referring again to FIG. 2, so one or more of the plurality of color filters 131, 132 and 133 are disposed to be higher than the other color filter(s), one or more of the plurality of sub-electrodes 1141, 1142 and 1143 is provided to be higher. For example, as shown in FIG. 2, when the height of the second color filter 132 is higher than that of the first color filter 131 and/or the third color filter 133, the height of the second sub-electrode 1142 is higher than that of the first sub-electrode 1141 and/or the third sub-electrode 1143. In this example, the first bank 1151 covers the edge of each of the first sub-electrode 1141 and/or the third sub-electrode 1143. Therefore, the first bank 1151 contacts the edge of each of the first sub-electrode 1141 and/or the third sub-electrode 1143.

To dispose the second sub-electrode 1142 to be higher, the first bank 1151 can be provided entirely over the second subpixel SP2. Therefore, the first bank 1151 partially covers a connection electrode CE connected to the thin film transistor 112. Because the connection electrode CE is disposed on the upper surface of the planarization layer 113, the connection electrode CE can be provided in the same layer as the first sub-electrode 1141 and/or the third sub-electrode 1143.

In addition, one side of the connection electrode CE according to an example can be connected to the source electrode 112*c* or the drain electrode 112*d* of the thin film transistor 112 through a contact hole passing through the planarization layer 113 and the passivation layer 111*c*. Also, the other side of the connection electrode CE can contact the lower surface of the second sub-electrode 1142 through a contact hole passing through the first bank 1151. Therefore, the connection electrode CE can be electrically connected to the second sub-electrode 1142 to transfer the signal or power source applied from the signal line SL to the second sub-electrode 1142.

As the second sub-electrode 1142 is disposed on the upper surface of the first bank 1151 disposed in the second subpixel SP2, the second sub-electrode 1142 is disposed higher than the other sub-electrodes 1141 and 1143. The second bank 1152 also covers the edge of the second sub-electrode 1142 on the first bank 1151. Therefore, the second bank 1152 contacts the edge of the second sub-electrode 1142.

Also, the organic light emitting layer 116 formed in the subsequent process can be provided as a common layer to cover the second sub-electrode 1142 disposed on the first bank 1151 in the second subpixel SP2, the first sub-electrode 1141 disposed on the planarization layer 113 in the first subpixel SP1, the third sub-electrode 1143 disposed on the planarization layer 113 in the third subpixel SP3, the first bank 1151 and the second bank 1152.

Further, the encapsulation layer 118 for preventing moisture permeation is formed on the organic light emitting layer 116. Because the encapsulation layer 118 is formed along a profile of the organic light emitting layer 116, the encapsulation layer 118 can be provided in the plurality of subpixels at the same thickness. As shown in FIG. 2, because the second sub-electrode 1142 is higher than the other sub-electrodes 1141 and 1143, the encapsulation layer 118 formed on the second sub-electrode 1142 is disposed higher than the encapsulation layer 118 formed on the other sub-electrodes 1141 and 1143.

The color filter 130 is also disposed on the encapsulation layer 118. Because the color filter 130 is formed along a profile of the encapsulation layer 118, as shown in FIG. 2, the second color filter 132 is disposed higher than the first color filter 131 and/or the third color filter 133. That is, the upper surface 131*a* of the first color filter 131 is disposed higher than the upper surface 132*a* of the second color filter 132 and the upper surface 133*a* of the third color filter 133. Therefore, a portion of the side 132*b* of the second color filter 132 protrudes more toward the second substrate 190 than the upper surface 131*a* of the first color filter 131 and/or the upper surface 133*a* of the third color filter 133, and thus is in contact with the light path changing layer 150 formed in the subsequent process. In this instance, the portion of the side 132*b* of the second color filter 132 corresponds to a portion that is not in contact with the side 131*b* of the first color filter 131 and/or the side 133*b* of the third color filter 133, or a portion that is not overlapped with the side 131*b* and/or the side 133*b* in the first direction. Also, the first direction refers to a direction parallel with the upper surface of the first substrate 110 or a direction in which the first subpixel SP1 and the second subpixel SP2 are adjacent to each other.

As a portion of the side 132*a* of the second color filter 132 contacts the light path changing layer 150, the side light L1 can be converted into the front light L2 by total reflection due to a difference in a reflective index on a boundary surface between the portion of the side 132*a* of the second color filter 132 and the light path changing layer 150. In this instance, the conversion or change means the path of light or the direction of light is changed. Therefore, because the side light L1 emitted toward the adjacent subpixel SP is converted into the front light L2, the front light efficiency of each subpixel can be improved.

In addition, as the second sub-electrode 1142 is provided to be higher than the first sub-electrode 1141 and/or the third sub-electrode 1143, the length between the first sub-electrode 1141 and the second sub-electrode 1142 is increased compared with the sub-electrodes having the same height. Because the path of the organic light emitting layer 116 provided between the first sub-electrode 1141 and the second sub-electrode 1142 is longer than the sub-electrodes having the same height, the leakage current to the adjacent subpixel can be reduced or avoided. In addition, because the thickness of the organic light emitting layer 116 is reduced in the taper area due to the taper TP of the bank 115, the resistance of the organic light emitting layer 116 can be increased, whereby decrease and blocking of the leakage current can be maximized, and thus a color mixture between the subpixels can be avoided.

Figure 4:
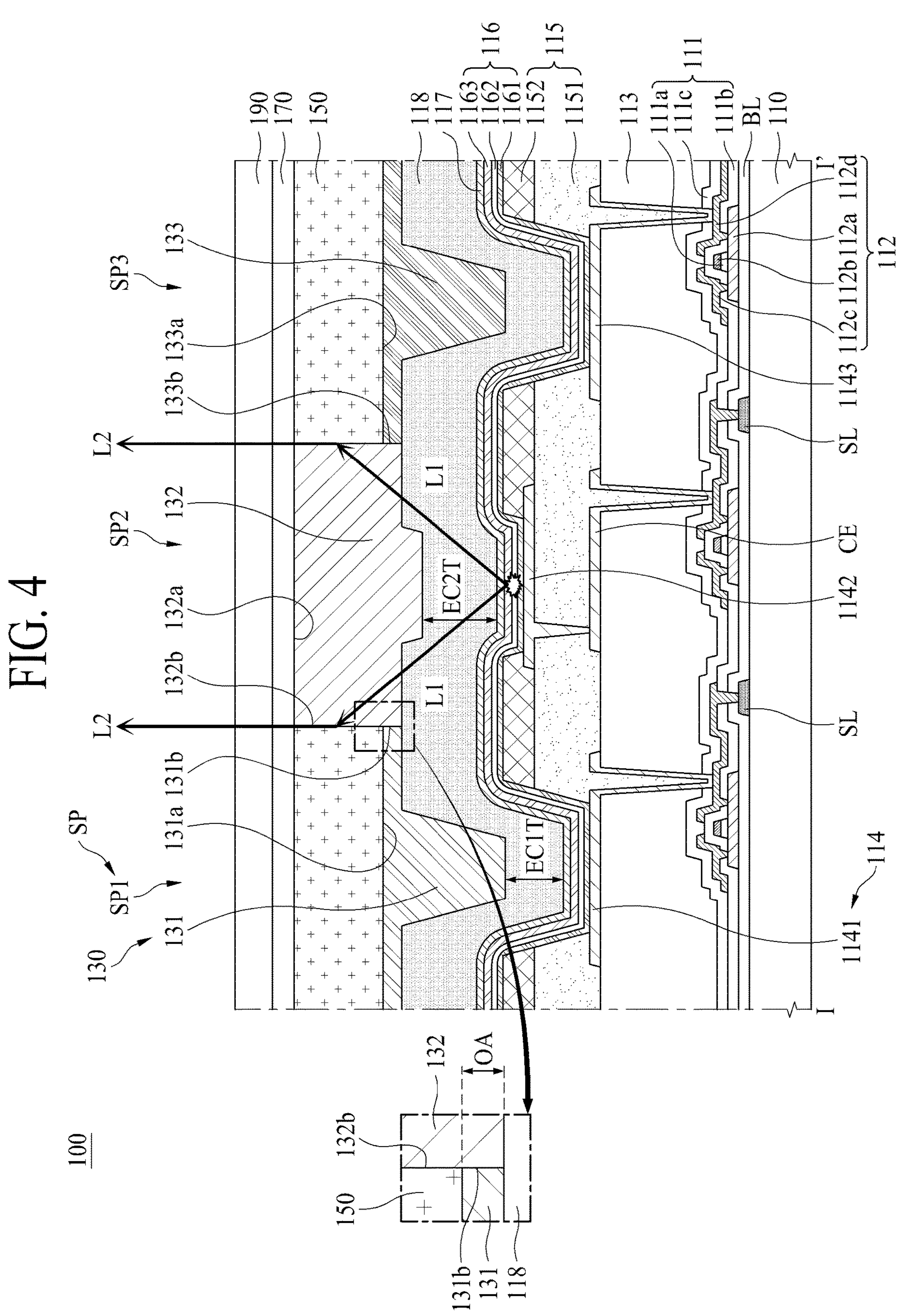
FIG. 4 is a schematic cross-sectional view illustrating a display apparatus according to another embodiment of the present disclosure.

Next, FIG. 4 is a schematic cross-sectional view illustrating a display apparatus according to another embodiment of the present disclosure. Referring to FIG. 4, the display apparatus 100 is like the display apparatus of FIG. 2 except that the height of the color filter 130 is changed according to a structure change of the encapsulation layer 118. Therefore, the same reference numerals are given for the same elements, and elements different from those of FIG. 2 are described.

In FIG. 2, the encapsulation layer 118 having the same thickness is formed on the organic light emitting layer 116, so that the side 132*b* of the second color filter 132, the side 131*b* of the first color filter 131 and the side 133*b* of the third color filter 133 are overlapped with one another as much as about 50% in the first direction. Therefore, in the side 132*b* of the second color filter 132, which is not overlapped with the side 131*b* of the first color filter 131 and/or the side 133*b* of the third color filter 133, the light path can be converted into the front light due to a difference in a refractive index with the light path changing layer 150, whereby front light efficiency may be improved.

However, in FIG. 4, the encapsulation layer 118 provided in the first subpixel SP1 and the third subpixel SP3 is further etched or patterned in the second direction toward the first substrate 110 from the second substrate 190. Therefore, a thickness EC2T of the encapsulation layer 118 between the second color filter 132 and the first substrate 110 or the second sub-electrode 1142 is thicker than a thickness EC1T of the encapsulation layer 118 between the first color filter 131 and the first substrate 110 (or the first sub-electrode 1141). Alternatively, the thickness EC2T of the encapsulation layer 118 between the second color filter 132 and the first substrate 110 or the second sub-electrode 1142 can be thicker than a thickness of the encapsulation layer 118 between the third color filter 133 and the first substrate 110 or the third sub-electrode 1143.

In the display apparatus of FIG. 4, because the position of each of the first color filter 131 and the third color filter 133 is lowered in the second direction as much as the thickness of the encapsulation layer 118 patterned in the first subpixel SP1 and the third subpixel SP3, a length of an overlap area OA in which the side 132*b* of the second color filter 132 and the side 131*b* of the first color filter 131 overlap each other in the first direction is shortened. For example, in the display apparatus 100 according to the embodiment in FIG. 4, an overlap ratio of the side 132*b* of the second color filter 132 and the side 131*b* of the first color filter 131 in the first direction is less than 50%. Because an overlap ratio of the side 132*b* of the second color filter 132 and the light path changing layer 150 in the first direction is 50% or more, for example, 80% or more as shown in FIG. 4, the length of the boundary surface where the side 132*b* of the color filter 132 contacts the light path changing layer 150 can be increased. As a result, because the amount of light capable of converting the side light L2 into the front light L1 can be increased, the front light efficiency can be further increased.

Further, the encapsulation layer 118 is provided to be thinner in one or more of the plurality of subpixels, so that the height of the upper surface of the color filter disposed on the thin encapsulation layer 118 can be lower than the height of the upper surface of the color filter disposed in the other subpixel. For example, as shown in FIG. 4, the height of the upper surface 131*a* of the first color filter 131 and/or the upper surface 133*a* of the third color filter 133 is lower than the display apparatus of FIG. 2. However, even in the display apparatus 100 shown in FIG. 4, the light path changing layer 150 can be disposed to contact the side 132*b* of the second color filter 132 and the upper surface 131*a* of the first color filter 131 and/or the upper surface 133*a* of the third color filter 133 in the same manner as the display apparatus of FIG. 2. For the display apparatus 100 shown in FIG. 4, because the second color filter 132 protrudes more toward the second substrate 190 than the display apparatus shown in FIG. 2, the thickness of the light path changing layer 150 is thicker than that of the light path changing layer of FIG. 2.

Although the encapsulation layer 118 is further patterned to increase the boundary surface between the side 132*b* of the second color filter 132 and the light path changing layer 150, the present disclosure is not limited thereto, and the second sub-electrode 132 can be disposed higher than the second sub-electrode 132 of FIG. 2 without patterning of the encapsulation layer 118. Therefore, the boundary surface between the side 132*b* of the second color filter 132 and the light path changing layer 150 can be increased. In this instance, the second sub-electrode 132 is disposed on the second bank 1152 and an edge of the second sub-electrode 132 can be covered by another bank disposed on the second bank 1152.

Figure 5:
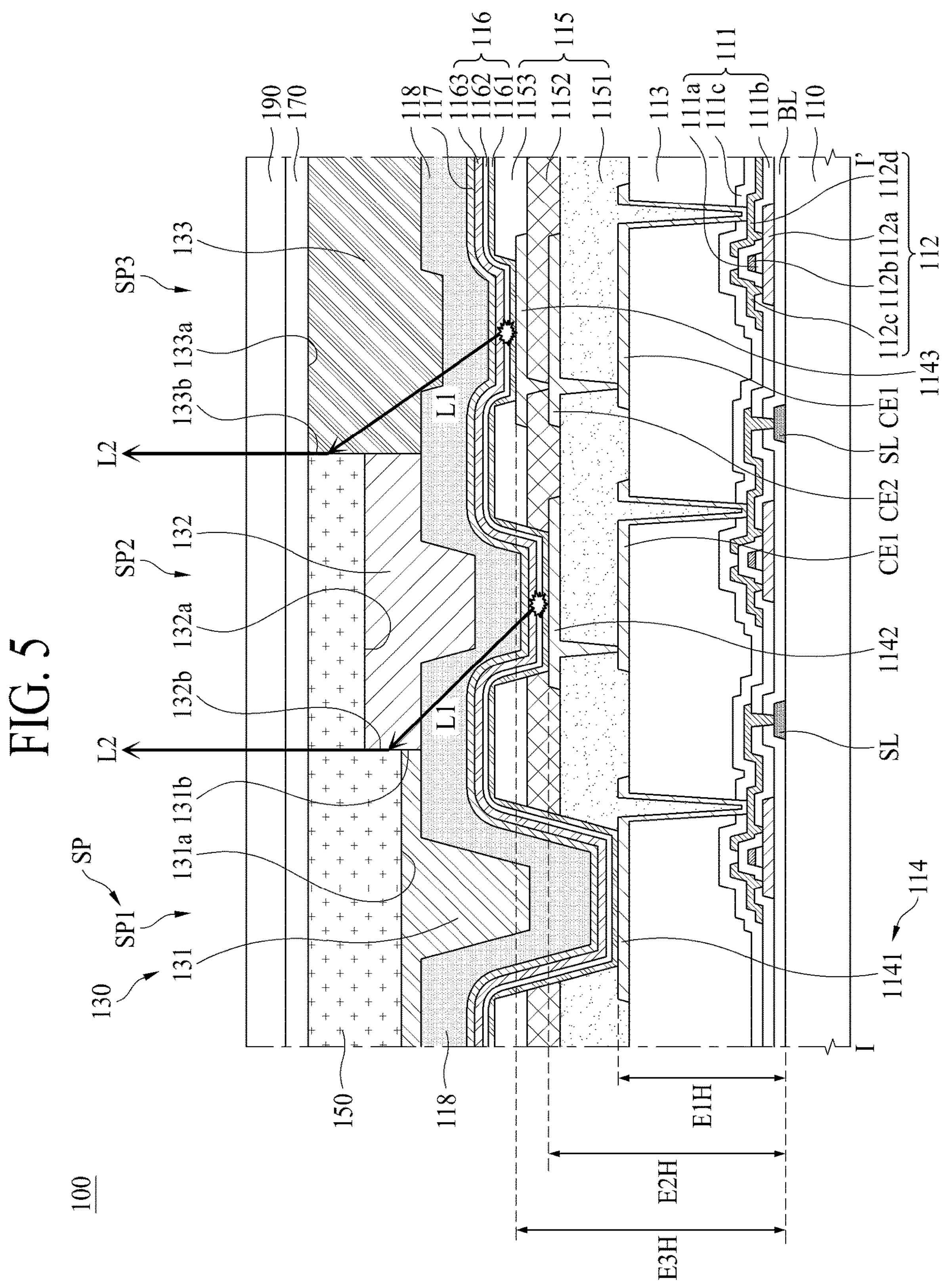
FIG. 5 is a schematic cross-sectional view illustrating a display apparatus according to yet another embodiment of the present disclosure.

Next, FIG. 5 is a schematic cross-sectional view illustrating a display apparatus according to another embodiment of the present disclosure. The display apparatus 100 in FIG. 5 is the same as the display apparatus of FIG. 2 except that the sub-electrodes and the color filter 130 disposed thereon are changed to a stepwise structure. Therefore, the same reference numerals are given for the same elements, and elements different from those of FIG. 1 are described. For convenience of description, side light emitted from the subpixel to one side is only shown in FIG. 5.

In FIG. 2, the first sub-electrode 131 and the third sub-electrode 133 are provided on the upper surface of the planarization layer 113, and the second sub-electrode 132 is provided on the upper surface of the first bank 1151, so that the second color filter 132 can be disposed higher than the first color filter 131 and the third color filter 133. Therefore, the light path can be changed or converted on the boundary surface between the side 132*b* of the second color filter 132 and the light path changing layer 150. Accordingly, the front light efficiency of the green light can be improved.

On the other hand, in FIG. 5, the first color filter 131, the second color filter 132 and the third color filter 133 are provided in a stepwise structure. In particular, the first sub-electrode 1141 disposed below the first color filter 131, the second sub-electrode 1142 disposed below the second color filter 132 and the third sub-electrode 1143 disposed below the third color filter 133 are provided in a stepwise manner in which the layers disposed below the respective sub-electrodes are provided differently from one another. For example, as shown in FIG. 5, the first sub-electrode 1141 is provided on the upper surface of the planarization layer 113, the second sub-electrode 1142 is provided on the upper surface of the first bank 1151 on the planarization layer 113, and the third sub-electrode 1143 is provided on the upper surface of the second bank 1152 on the first bank 1151. Therefore, the height E2H of the second sub-electrode 1142 is higher than the height E1H of the first sub-electrode 1141, and is lower than the height E3H of the third sub-electrode 1143.

After the sub-electrodes are formed in the stepwise structure as described above, the organic light emitting layer 116, the second electrode 117, the encapsulation layer 118, the color filter 130, and the light path changing layer 150 are sequentially formed, and the light path changing layer 150 is provided on the side 132*b* of the second color filter 132 and the side 133*b* of the third color filter 133. In this instance, the light path changing layer 150 has a structural characteristic in which it is disposed on the upper surface 131*a* of the first color filter 131 and the upper surface 132*a* of the second color filter 132. Therefore, the light path can be changed toward the front surface directed toward the second substrate 190 even on the side 133*b* of the third color filter 133 adjacent to the light path changing layer 150 as well as the side 132*b* of the second color filter 132 adjacent to the light path changing layer 150.

To planarize the upper layer 170 formed on the color filter 130, the thickness of the light path changing layer 150 on the upper surface 131*a* of the first color filter 131 and the side 132*b* of the second color filter 132 can be thicker than that of the light path changing layer 150 on the upper surface 132*a* of the second color filter 132 and the side 133*b* of the third color filter 133. Further, the upper layer 170 can be planarized to prevent a gap with the second substrate 190 from occurring. When the gap occurs between the upper layer 170 and the second substrate 190, the second substrate 190 having an encapsulation function can be easily damaged due to an external impact thereby reducing a moisture permeable function. Thus, the reliability of the display apparatus may be deteriorated. Therefore, in the display apparatus 100 according to the embodiment in FIG. 5, as the light path changing layer 150 overlapped with the first subpixel SP1 is thicker than the light path changing layer 150 overlapped with the second subpixel SP2, the gap can be prevented from being formed between the upper layer 170 and the second substrate 190, to improve the reliability.

Referring again to FIG. 5, the bank 115 includes a first bank 1151, a second bank 1152 disposed on the first bank 1151 and a third bank 1153 disposed on the second bank 1152. The first bank 1151 contacts an edge of the first sub-electrode 1141 by covering the edge of the first sub-electrode 1141. Also, the second bank 1152 contacts an edge of the second sub-electrode 1142 by covering the edge of the second sub-electrode 1142. The third bank 1153 contacts an edge of the third sub-electrode 1143 by covering the edge of the third sub-electrode 1143. As shown in FIG. 5, the first sub-electrode 1141 is disposed on the upper surface of the planarization layer 113, the second sub-electrode 1142 is disposed on the upper surface of the first bank 1151, and the third sub-electrode 1143 is disposed on the upper surface of the second bank 1152. Therefore, the first sub-electrode 1141, the second sub-electrode 1142 and the third sub-electrode 1143 are provided in a stepwise structure in which their heights are gradually increased toward a right direction based on FIG. 5.

Because the second sub-electrode 1142 is disposed higher than the first sub-electrode 1141, the second sub-electrode 1142 can be electrically connected to the thin film transistor 112 through a first connection electrode CE1 disposed on the planarization layer 113 in the second subpixel SP2. Further, the first connection electrode CE1 provided in the second subpixel SP2 can be disposed on the same layer as the first sub-electrode 1141, for example, the upper surface of the planarization layer 113, and be partially covered by the first bank 1151. The other side of the first connection electrode CE1 that is not covered by the first bank 1151 contacts the lower surface of the second sub-electrode 1142. One side of the first connection electrode CE1 can be connected to the source electrode 112*c* or the drain electrode 112*d* of the thin film transistor 112 through a contact hole formed by passing through the planarization layer 113 and the protective layer 111*c*.

Because the third sub-electrode 1143 is disposed higher than the second sub-electrode 1142, the third sub-electrode 1143 can be electrically connected to the thin film transistor 112 through the first connection electrode CE1 disposed on the planarization layer 113 in the third subpixel SP3 and a second connection electrode CE2 disposed on the first bank 1151. The first connection electrode CE1 provided in the third subpixel SP3 can also be disposed on the same layer as the first sub-electrode 1141, for example, the upper surface of the planarization layer 113, and be partially covered by the first bank 1151. The other side of the first connection electrode CE1, which is not covered by the first bank 1151, also contacts the lower surface one side of the second connection electrode CE2 of the second connection electrode CE2. One side of the first connection electrode CE1 provided in the third subpixel SP3 can also be connected to the source electrode 112*c* or the drain electrode 112*d* of the thin film transistor 112 through the contact hole formed by passing through the planarization layer 113 and the passivation layer 111*c*.

In addition, the second connection electrode CE2 can be disposed on the same layer as the second sub-electrode 1142, for example, the upper surface of the first bank 1151, and be partially covered by the third bank 1153. The other side of the second connection electrode CE2, which is not covered by the second bank 1152, contacts the lower surface of the third sub-electrode 1143. Therefore, the third sub-electrode 1143 can be electrically connected to the first connection electrode CE1 provided in the third subpixel SP3 and the second connection electrode CE2, so that a driving signal and/or driving power applied from the thin film transistor 112 can be transferred thereto.

As a result, in the display apparatus 100 according to the embodiment in FIG. 5, as the first color filter 131, the second color filter 132 and the third color filter 133 are provided in a stepwise structure, the light path can be changed toward the front surface directed toward the second substrate 190 even on the side 133*b* of the third color filter 133 adjacent to the light path changing layer 150 as well as the side 132*b* of the second color filter 132 adjacent to the light path changing layer 150. Accordingly, the light efficiency of each different color, for example, green light and blue light can be improved.

Figure 6:
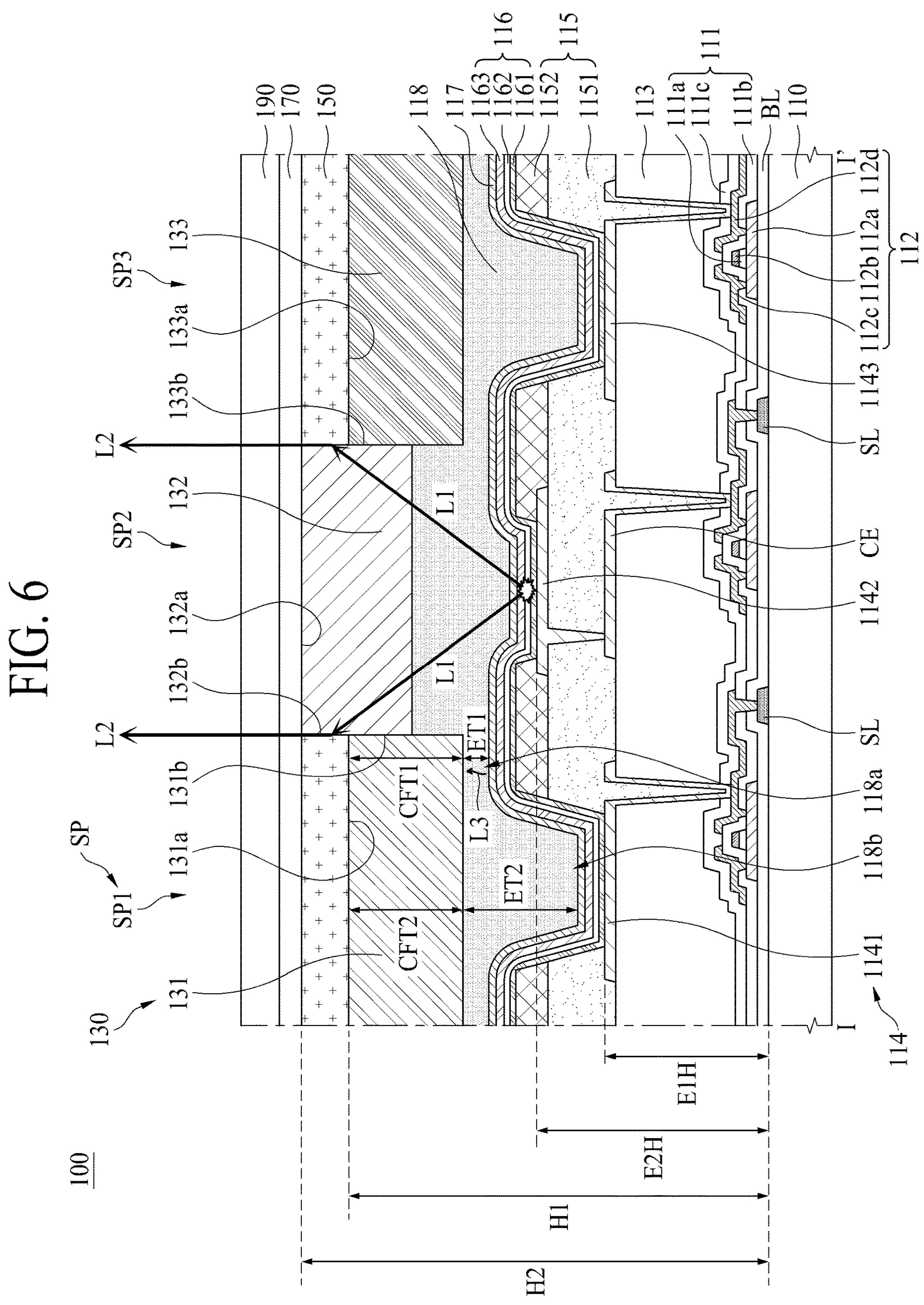
FIG. 6 is a schematic cross-sectional view illustrating a display apparatus according to still another embodiment of the present disclosure.

Next, FIG. 6 is a schematic cross-sectional view illustrating a display apparatus according to still another embodiment of the present disclosure. The display apparatus 100 in FIG. 6 is the same as the display apparatus of FIG. 2 except that the lower surface of the color filter 130 disposed in each subpixel is flat. Therefore, the same reference numerals are given for the same elements, and elements different from those of FIG. 1 are described.

In the display apparatus shown in FIG. 1, because the color filter 130 is formed along the profile of the encapsulation layer 118 having the same thickness for each subpixel, the lower surface of the color filter 130 disposed in each subpixel is provided in the same shape as the profile of the encapsulation layer 118.

On the other hand, for the display apparatus shown in FIG. 6, the lower surface of each of the first color filter 131, the second color filter 132 and the third color filter 133 is flat. That is, after the upper surface of each of the encapsulation layer 118 provided in the first subpixel SP1, the encapsulation layer 118 provided in the second subpixel SP2 and the encapsulation layer 118 provided in the third subpixel SP3 is patterned to be flat through a photo process using a mask and an etching process, the color filters of colors corresponding to the respective subpixels can be formed at the same thickness. Therefore, each of the lower surface of the first color filter 131 contacting the encapsulation layer 118 of the first subpixel SP1, the lower surface of the second color filter 132 contacting the encapsulation layer 118 of the second subpixel SP2, and the third color filter 133 contacting the encapsulation layer 118 of the third subpixel SP3 can be provided to be flat.

As each of the lower surface of the first color filter 131, the lower surface of the second color filter 132 and the lower surface of the third color filter 133 is flat, the encapsulation layer 118 overlapped with the bank 115 in each subpixel can be provided to be thinner than the encapsulation layer 118 not overlapped with the bank 115. For example, in the first subpixel SP1, the encapsulation layer 118 can include a first area 118*a* overlapped with the bank 115 at a boundary portion between the second subpixels SP2, and a second area 118*b* that is not overlapped with the bank 115. As shown in FIG. 6, as the lower surface of the first color filter 131 is planarized, a thickness ET1 of the first area 118*a* of the encapsulation layer 118 can be thinner than a thickness ET2 of the second area 118*b*.

However, a thickness CFT1 of the first color filter 131 overlapped with the first area 118*a* of the encapsulation layer 118 in the second direction or thickness direction of the first substrate 110 may be equal to a thickness CFT2 of the first color filter 131 overlapped with the second area 118*b* in the second direction. Because the upper surface of the encapsulation layer 118 provided in the first subpixel SP1 is flat, the thickness of the first color filter 131 formed on the encapsulation layer 118 can be uniformly provided in the first subpixel SP1. Therefore, in the display apparatus 100 in FIG. 6, even though leakage light L3 is generated on the bank 115 by a leakage current from the subpixel (first subpixel SP1) for emitting light to the subpixel (second subpixel SP2) for not emitting light, the color filter 130 overlapped with the bank is thick, whereby the leakage current L3 can be shielded, and the amount of light emitted through the color filter 130 can be reduced.

For example, the leakage light L3 can be generated at the portion of the taper TP of the bank 115, and the organic layer 116 (or the first stack 1161 of the organic light emitting layer 116) becomes thinner in the portion of the taper TP, so that yellow-green light of the second stack 1163 may be mainly emitted rather than blue light of the first stack 1161. Because the intensity of the emitted light is not great due to a resistance caused by the thin thickness of the organic light emitting layer 116, the yellow-green leakage light L3 does not pass through the red thick color filter on the bank and as a result can be extinguished, or be weakly emitted although passing through the red color filter.

In another example, in the stack structure of the organic light emitting layer 116, when the second stack 1163 includes a light emitting layer for emitting blue light, the blue leakage light L3 cannot pass through the red color filter, and thus can be shielded. As a result, the lower surface of the color filter 130 disposed in each subpixel is provided to be flat, so that the color filter 130 overlapped with the bank 115, that is, the color filter 130 overlapped with the non-light emission area, can be provided to be thicker than the color filter 130 overlapped with the non-light emission area of another embodiment.

Because the color filter provided to be thick in the non-light emission area can shield the leakage light L3 of another color emitted from the non-light emission area, color purity of the subpixel for emitting light can be improved. Also, the color filter provided to be thick in the non-light emission area also reduces the amount of the leakage light L3 of the same color, which is emitted from the non-light emission area, thereby preventing a color mixture with an adjacent subpixel from occurring.

Next, FIG. 7 is a schematic cross-sectional view illustrating another example of a display apparatus according to yet another embodiment of the present disclosure. Referring to FIG. 7, the upper layer 170 has the same refractive index as that of the light path changing layer 150. Having the same refractive index means the corresponding layers are formed of the same material or include the same refractive index if formed of different materials. For example, the upper layer 170 and the light path changing layer 150 can be formed of air to have the same refractive index. Although FIG. 7 shows hatching to represent that the upper layer 170 and the light path changing layer 150 have the same refractive index, the hatching can be omitted when the upper layer 170 and the light path changing layer 150 are formed of air. As shown in FIG. 7, as the upper layer 170 and the light path changing layer 150 are formed of air to have the same refractive index, the air contact an upper surface of each of the plurality of color filters and a protruded side of the color filter. In this instance, the light path can be changed even on the upper surface of the color filter as well as the protruded side of the color filter.

Because the upper layer 170 is made of air, an opposite substrate on the upper layer 170, that is, the second substrate 190, can be bonded to the first substrate 110 or encapsulation layer 118 by the adhesive layer 180. Therefore, as shown in FIG. 7, the adhesive layer 180 can be provided to surround the upper layer 170 made of air. In this instance, the adhesive layer 180 can be provided to surround the light path changing layer 150.

In addition, the upper layer 170 can be provided to have a refractive index smaller or lower than that of the light path changing layer 150. For example, the light path changing layer 150 can be formed of a material having a refractive index, which is smaller than that of the color filter 130 but is greater than 1, and the upper layer 170 can be formed of air. Even in this instance, because the light path can be changed on the boundary surface where the protruded side of the color filter 130 and the light path changing layer 150 are adjacent to each other, the front light efficiency can be improved. In addition, the light path can be changed even on the boundary surface between the upper surface of the color filter 130 and the upper layer 170 that is the air.

Although the upper layer 170 is made of one material in the above example, the upper layer 170 disposed on the color filter 130 may be made of partially different materials to further improve front light efficiency. For example, the material of the upper layer 170 disposed to overlap the boundary portion or bank 115 between the plurality of subpixels may be made of a material having a refractive index lower than that of the material of the upper layer 170 disposed to overlap a central portion of the subpixel, so that the light path can be changed toward a center portion of the subpixel in the materials constituting the upper layer 170, thereby improving front light efficiency.

As a result, the light path changing layer 150 adjacent to the color filter 130 and/or the upper layer 170 can be provided to have a refractive index lower than that of the color filter 130, so that the light path of the side light emitted toward the adjacent subpixel can be changed to improve front light efficiency. Also, as one or more of the plurality of color filters are provided to be further protruded toward the second substrate 190, the light path of the side light can be changed to the front direction from the first substrate 110 to the second substrate 190 even on the boundary surface between the protruded side of the color filter and the light path changing layer 150, thereby maximizing front light efficiency. In addition, as the plurality of color filters have a stepwise structure, the side light L1 emitted from different subpixels can be converted into the front light L2, whereby light efficiency of different colors can be improved.

According to embodiments of the present disclosure, the following advantageous effects can be obtained. As the light path changing layer is provided on the side of one or more of the color filters respectively provided in the plurality of subpixels, the front light efficiency can be improved. Further, as the first electrodes respectively provided in the plurality of subpixels have their respective heights different from each other, the length of the organic light emitting layer provided between the subpixels is lengthened so that the leakage current can be reduced or blocked. In addition, as the bank covering the edge of the first electrode has a taper, the thickness of the organic light emitting layer overlapped with the taper becomes thinner, whereby the leakage current to the adjacent subpixel can be reduced or blocked.

Also, as the thickness of the color filter overlapped with the non-light emission area is equal to that of the color filter overlapped with the light emission area, transmittance of light due to the leakage current can be reduced or blocked, whereby color purity can be improved.

It will be apparent to those skilled in the art that the present disclosure described above is not limited by the above-described embodiments and the accompanying drawings and that various substitutions, modifications and variations may be formed in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:

a plurality of pixels disposed on a substrate, wherein each pixel includes a first subpixel, a second subpixel adjacent to the first subpixel, and a third subpixel adjacent to the second subpixel, the second subpixel disposed between the first subpixel and the third subpixel;

a first color filter disposed in the first subpixel, and configured to emit light having a first color;

a second color filter disposed in the second subpixel, and configured to emit light having a second color; and a third color filter disposed in the third subpixel, and configured to emit light having a third color, wherein an upper surface of the second color filter is disposed a greater distance from the substrate than an upper surface of the first color filter, wherein the first subpixel further includes a first light path changing layer disposed on the first color filter and contacting a first side surface of the second color filter, and wherein the second subpixel does not include a light path changing layer.

2. The display device of claim 1, wherein the upper surface of the second color filter is disposed a greater distance from the substrate than an upper surface of the third color filter.

3. The display device of claim 2, wherein the upper surface of the third color filter is disposed a same distance from the substrate as the upper surface of the first color filter.

4. The display device of claim 2, wherein the third subpixel further includes a third light path changing layer disposed on the third color filter and contacting a second side surface of the second color filter.

5. The display device of claim 4, wherein the first light path changing layer and the third light path changing layer comprise a same material and thickness.

6. The display device of claim 4, wherein an upper surface of the first light path changing layer, the upper surface of the second color filter and an upper surface of the third light path changing layer comprise a flat surface.

7. The display device of claim 4, wherein the first and third light path changing layers respectively disposed on the first and third color filters comprise a layer of air, and wherein a layer of air exists between the upper surface of the second color filter and a cover substrate covering the pixels.

8. The display device of claim 1, wherein the upper surface of the first color filter is a first distance from an upper surface of the substrate, and an upper surface of the first light path changing layer is a second distance from the upper surface of the substrate, and wherein the second distance is greater than the first distance.

9. The display device of claim 8, wherein an upper surface of a first electrode of the first subpixel is a third distance from the upper surface of the substrate, and an upper surface of a first electrode of the second subpixel is a fourth distance from the upper surface of the substrate, and wherein the fourth distance is greater than the third distance, and the fourth distance is less than the first distance.

10. The display device of claim 1, wherein a refractive index of the first light path changing layer is less than a refractive index of the second color filter.

11. The display device of claim 10, wherein the first light path changing layer is formed of air.

12. The display device of claim 1, wherein the second color filter protrudes away from the substrate more than the first color filter or the third color filter.

13. The display device of claim 1, wherein each pixel further comprises:

an inorganic layer disposed on the substrate and including a plurality of transistors for driving the first subpixel, the second subpixel and the third subpixel to emit light;

a planarization layer disposed on the inorganic layer;

a bank disposed on the planarization layer and including a first opening to expose a first electrode of the first subpixel, a second opening to expose a first electrode of the second subpixel and a third opening to expose a first electrode of the third subpixel;

an organic light emitting layer disposed on the bank and within the first, second and third openings to directly contact the first electrodes of the first, second and third subpixels, wherein the first and third openings are deeper than the second opening, and the first electrode of the second subpixel is disposed higher than the first electrodes of the first subpixel and the third subpixel;

a second electrode disposed on the organic light emitting layer; and an encapsulation layer disposed on the second electrode.

14. The display device of claim 13, wherein the bank includes a first structure and a second structure stacked on the first structure, and wherein the first electrode of the second subpixel is disposed directly on the first structure of the bank, and the first electrodes of the first subpixel and the third subpixel are disposed directly on the planarization layer such that the first electrode of the second subpixel is disposed a greater distance from the substrate than the first electrodes of the first and third subpixels.

15. The display device of claim 14, wherein the second structure comprises an angled edge-shaped taper having an inclined surface connected to the first electrode of the second subpixel such that a thickness of the organic light emitting layer overlapped with the taper in a thickness direction of the substrate is thinner than a thickness of the organic light emitting layer not overlapped with the taper.

16. The display device of claim 1, wherein an upper surface of the third color filter is disposed a greater distance from the substrate than the upper surface of the second color filter.

17. The display device of claim 16, wherein the upper surfaces of the first color filter, the second color filter and the third color filter increase stepwise in distance from the substrate.

18. The display device of claim 17, wherein a stepwise increase in distance from the upper surface of the first color filter to the upper surface of the second color filter is a first distance, and a stepwise increase in distance from the upper surface of the second color filter to the upper surface of the third color filter is a second distance.

19. The display device of claim 18, wherein the second distance is greater than the first distance.

20. The display device of claim 17, wherein an upper surface of a first electrode of the first subpixel is a first distance from an upper surface of the substrate, an upper surface of a first electrode of the second subpixel is a second distance from the upper surface of the substrate, and an upper surface of a first electrode of the third subpixel is a third distance from the upper surface of the substrate, and wherein the third distance is greater than the second distance, and the second distance is greater than the first distance.

21. The display device of claim 16, wherein the second subpixel further includes a second light path changing layer disposed on the second color filter and contacting a side surface of the third color filter.

22. The display device of claim 1, wherein a lower surface of the first color filter, a lower surface of the second color filter and a lower surface of the third color filter are flat.

* * * * *